United States Patent [19]

Lo et al.

[11] Patent Number: 4,789,952
[45] Date of Patent: Dec. 6, 1988

[54] METHOD AND APPARATUS FOR DIGITAL COMPENSATION AND DIGITAL EQUALIZATION

[75] Inventors: Pei-hwa Lo, Ramsey, N.J.; Tran Thong, Beaverton, Oreg.

[73] Assignee: Tektronix, Inc., Beaverton, Oreg.

[21] Appl. No.: 947,158

[22] Filed: Dec. 29, 1986

[51] Int. Cl.$^4$ ............................................. G06F 15/31
[52] U.S. Cl. ..................................... 364/724.2; 375/13
[58] Field of Search ................. 364/724; 375/12, 13, 375/14

[56] References Cited

U.S. PATENT DOCUMENTS

| | | | |
|---|---|---|---|
| 4,141,072 | 2/1979 | Perreault | 375/12 |
| 4,397,029 | 8/1983 | Satorius et al. | 375/13 |
| 4,539,689 | 9/1985 | Chiu et al. | 375/13 |
| 4,571,732 | 2/1986 | Pirani et al. | 375/12 |
| 4,581,747 | 4/1986 | Prezas et al. | 375/14 |
| 4,637,035 | 1/1987 | Betts | 375/12 |
| 4,695,969 | 9/1987 | Sollenberger | 364/724 |

*Primary Examiner*—David M. Malzahn
*Attorney, Agent, or Firm*—Allston L. Jones; Robert S. Hulse

[57] ABSTRACT

A method and apparatus are disclosed which provide for the removal of distortion present in a digital output signal from a linear analog signal processing system. Two applications are disclosed: digital compensation and digital equalization. Digital compensation provides for the removal of distortion from a single signal processing system. In particular, an adaptive digital filter operates to provide processing of an output signal from the signal processing system in accordance with correction criteria determined by a controller in response to a training signal. Digital equalization is employed with respect to a plurality of signal processing systems, and provides equalization of an output signal from one signal processing system in accordance with characteristics of a selected signal processing system. In particular, output signals from a selected signal processing system and a signal processing system desired to be equalized are employed to provide information to a controller for use with a correction criteria in the determination of correction information. The correction information is used to direct an adaptive digital filter coupled to an output of the signal processing system which is desired to be equalized.

16 Claims, 6 Drawing Sheets

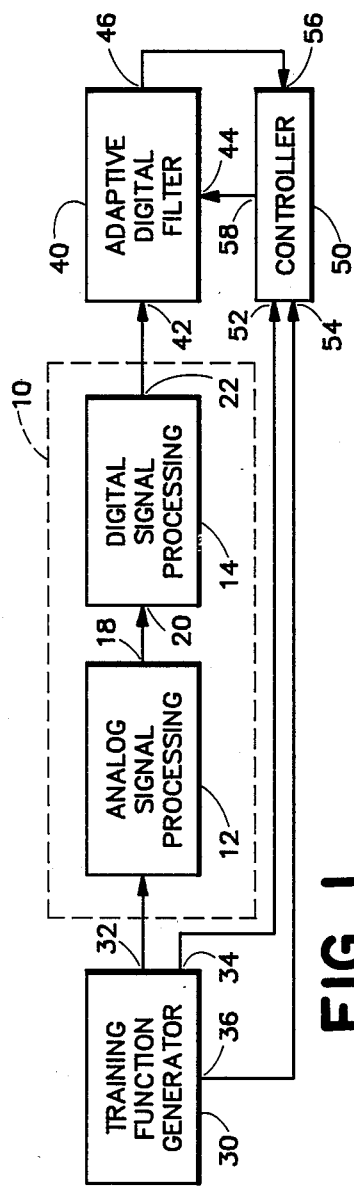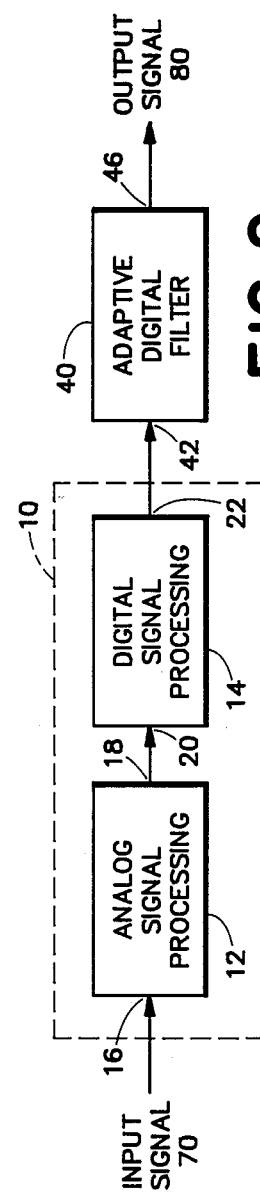

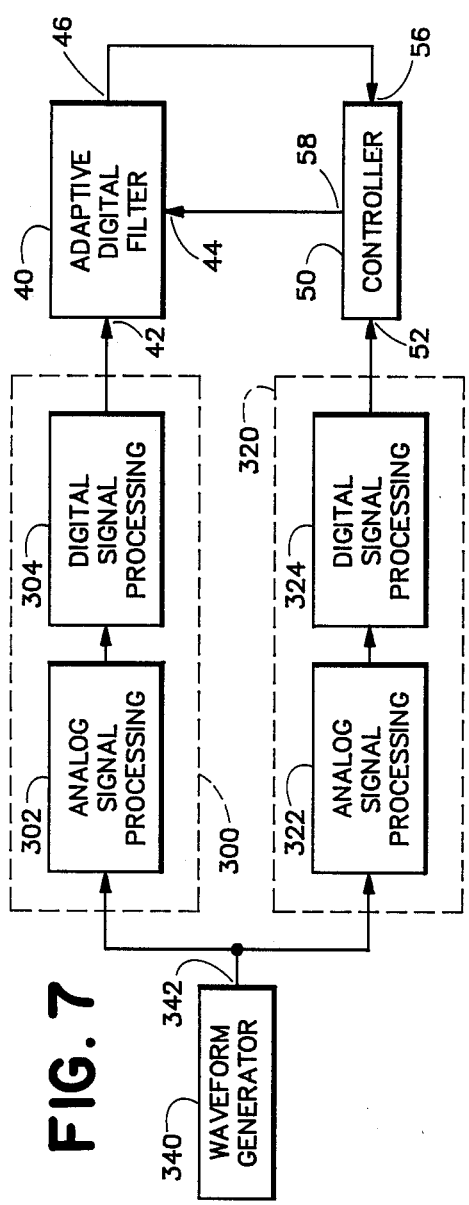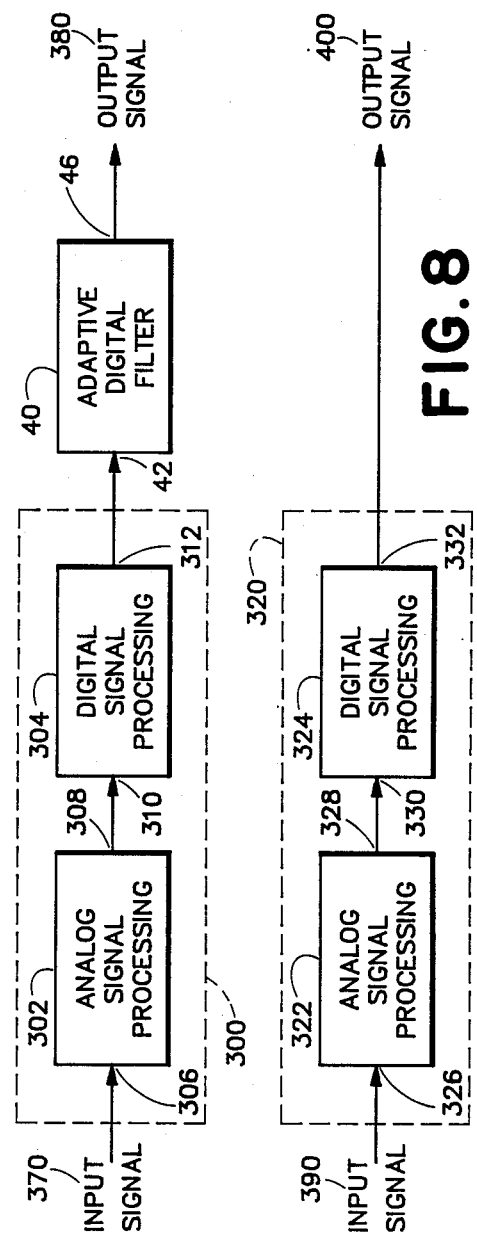

METHOD AND APPARATUS FOR DIGITAL COMPENSATION AND DIGITAL EQUALIZATION

BACKGROUND

This invention relates to the field of signal correction, and more particularly to a digital compensation/equalization technique which corrects amplitude and/or phase distortions arising from non-ideal linear system performance.

A linear analog system generally has operational characteristics associated therewith which operate to limit an overall system response, e.g., oscillations in response to a step input, limited frequency response, etc. Such limitations may arise for a variety of reasons, including inaccuracy of components used to implement the system (1% to 5% tolerances on component values), drifting of device operation points, e.g., with changes in temperature and other non-ideal performance of individual system components.

In the past, a number of approaches have been employed in attempts to remove undesirable effects introduced by analog signal processing apparatus. Such approaches have been of both an analog and a digital nature. With respect to the analog approaches, a filter circuit is generally employed having a transfer function selected to compensate for the undesirable effects. Consequently, when the signal from the analog signal apparatus is coupled to the analog filter, the resultant signal therefrom will closely resemble the original signal, with the undesirable effects introduced by the analog signal apparatus reduced. While such an approach has offered varying degrees of success, analog filter circuits suffer from the same limitations associated with analog signal processing apparatus. Consequently, such an approach provides a limited solution to the problem.

In an alternate approach, digital filters have been employed. However, the process to determine the necessary design information for the required digital filter has been cumbersome. In particular, a known signal is first passed through the analog signal apparatus. The results thereof are thereafter transformed to the frequency domain. Once in the frequency domain, a description of a desired filter operation may be obtained by dividing a desired response of the analog signal apparatus by the response observed to the known signal. An inverse Fourier Transform operation is thereafter performed to transfer the results of the division process back into the time domain. The foregoing described process results in a description of a digital filter having a transfer function to effect the removal of undesirable effects of the analog signal apparatus. While such an approach does provide design information with respect to the desired digital filter, the resulting digital filter typically has associated therewith a large number of signal taps. Consequently, a large number of computations are required. Such a resulting filter is undesirable from a practical standpoint.

It is consequently an object of the present invention to achieve a digital signal compensator/equilizer which has a small computational load and a simple adaptive algorithm. It is a further object of the present invention to achieve an implementation structure for a compensator/equalizer which is highly flexible and may consequently accommodate different applications.

SUMMARY OF THE INVENTION

In accordance with the present invention, a method and apparatus are disclosed which provide for the correction of analog system inaccuracies so that resultant system performance will closely resemble a desired response. A digital compensator/equalizer is employed, and consists of a training function generator, an adaptive digital filer and a controller which directs the adaptation of the digital filter.

A signal acquisition system may be comprised of both analog and digital signal processing portions. The analog portion may comprise probes, amplifiers, filters and waveform/signal processors. The digital portion may comprise a sample/hold circuit, analog-to-digital converter and associated memory. In a system training phase, an input signal is sent from a training function generator through the signal acquisition system, e.g., both the analog and digital portions, the resultant signal therefrom being referred to as the distorted signal. The digital compensator/equalizer thereafter adapts the distorted signal to the input signal according to a correction criteria. Correction criteria include Least Mean Square, Least Square, Gradient Search or similar correction methods. Subsequent to the system training phase, the digital compensator/equalizer is used in a normal mode as a fixed digital filter, providing compensation for most of the linear distortions introduced by the signal acquisition system.

In an alternate application, the digital compensator/equalizer may be used to equalize two or more signal channels. In particular, one signal channel is used as a reference channel, and the remaining signal channels are equalized such that a common input to all of the channels will produce outputs similar to that in the reference channel.

DESCRIPTION OF THE FIGURES

FIG. 1 is a functional block diagram of a training phase configuration for apparatus employing a digital compensator in accordance with the method and apparatus of the present invention.

FIG. 2 is a functional block diagram of an operational configuration for the apparatus of FIG. 1, subsequent to the training phase.

FIG. 7 is a functional block diagram of a training phase configuration for apparatus employing a digital equalizer in accordance with the method and apparatus of the present invention.

FIG. 8 is a functional block diagram of an operational configuration for the apparatus of FIG. 7, subsequent to the training phase.

DETAILED DESCRIPTION OF THE PREFERRED EMBODIMENT

Figure 3:
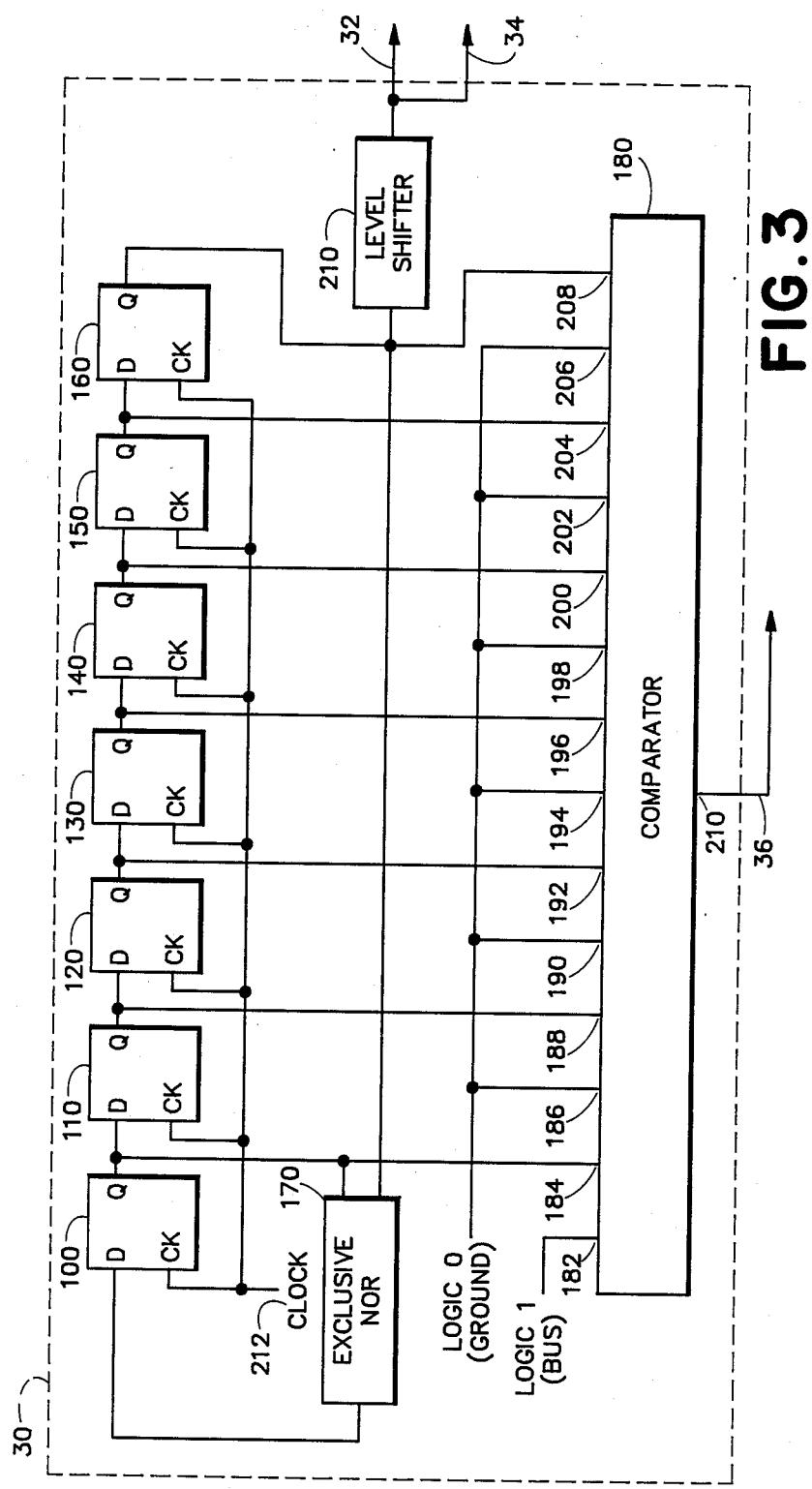
FIG. 3 is a diagram for one implementation of Training Function Generator 30 (FIG. 1).

Analog systems are subject to frequency limitations and hence generally produce signals having other than an intended shape. In accordance with the method and apparatus of the present invention, digital compensation may be used to compensate for analog system frequency limitations.

A digital compensator/equalizer of the present invention includes a training function generator, an adaptive digital filter and a controller that directs the adaptation of the digital filter. An analog system may consist of amplifiers, filters and similar waveform/signal processors. Analog systems may further have associated therewith digital systems consisting of sample/hold circuits, analog-to-digital converters and digital memory. The collective combination of an analog system with a digital system as above described will hereafter be referred to as a signal acquisition system. In accordance with the method and apparatus of the present invention, the input of a signal acquisition system is first coupled to receive a signal from a training function generator. Thereafter, the digital compensator/equalizer will compensate the output signal from the signal acquisition system so that the resultant signal more closely resembles the output signal from the training function generator. Correction criteria for performing the adaptation include the Least Mean Square, Least Square, Gradient Search or similar methods. Once the digital compensator/equalizer has been trained, it acts as a fixed digital filter. With a proper training signal, the digital compensator/equalizer can remove most of the linear distortions introduced by the signal acquisition system.

FIG. 1 is a functional block diagram of apparatus in accordance with the present invention. Included in FIG. 1 is a Signal Acquisition System 10 that has Analog Signal Processing apparatus 12 and Digital Signal Processing apparatus 14. Analog Signal Processing apparatus 12 has an input terminal 16 and an output terminal 18 associated therewith, and broadly represents any of a wide variety of analog signal processing circuits, e.g. amplifiers, filters and similar waveform/signal processors. In a similar manner, Digital Signal Processing apparatus 14 has an input terminal 20 and an output terminal 22 associated therewith, and broadly represents any of a wide variety of digital signal processing circuits, e.g., sample/hold apparatus, analog-to-digital converters and digital memory. Also shown is a Training Function Generator 30 having signal output terminals 32 and 34, and a trigger output terminal 36. In the functional apparatus illustrated in FIG. 1, the output signal produced by Training Function Generator 30 appears on terminal 32 in an analog format, and on terminal 34 in a digital format. It is to be understood that in the case where the output signal is binary in nature, i.e., having only two discrete states, the signals produced on terminals 32 and 34 would be identical. The trigger signal appearing on terminal 36 occurs coincident with the start of the output signal, and is used for synchronization purposes. It is to be understood in this regard that while the functional apparatus of FIG. 1 illustrates a trigger signal being produced by Training Function Generator 30, Training Function Generator 30 could likewise produce the aforediscussed output signals upon receipt of a trigger signal, as would be apparent to one of ordinary skill in the art. Additionally, an Adaptive Digital Filter 40 having an input terminal 42, a control terminal 44 and an output terminal 46 associated therewith is included, and functions to perform a selected filtering operation on a signal coupled to terminal 42 thereof in accordance with control information coupled to control terminal 44, as more fully discussed hereafter. Finally, a Controller 50 having input terminals 52, 54 and 56, and output terminal 58 associated therewith, is included and functions in response to signal information coupled to terminals 52, 54 and 56 thereof to produce control information on terminal 58 thereof for controlling Adaptive Digital Filter 40, as more fully discussed hereafter.

The apparatus of FIG. 1 operates in the following manner. Training Function Generator 30 provides a selected reference signal to Analog Signal Processing apparatus 12 and to Controller 50. Analog Signal Processing apparatus 12 and Digital Signal Processing apparatus 14 provide processing on the signal from Training Function Generator 30 in accordance with previously selected design criteria. However, as analog systems are subject to frequency limitations, and hence generally do not produce a signal in strict accordance with an intended design criteria. The resultant signal from terminal 22 of Digital Signal Processing apparatus 14 therefore departs from an expected signal as a result of the signal processing on the signal produced by Training Function Generator 30. Adaptive Digital Filter 40, responsive to control information coupled to terminal 44 thereof from Controller 50, functions to provide additional signal processing to remove undesirable effects introduced by Analog Signal Processing apparatus 12 and Digital Signal Processing apparatus 14. In particular, Controller 50 functions to compare the signal from terminal 34 of Training Function Generator 30 with the signal from terminal 46 of Adaptive Digital Filter 40, and in response to a detected difference therebetween, to produce control information on terminal 58 thereof which, when coupled to terminal 44 of Adaptive Digital Filter 40, operates to adjust the operation of Adaptive Digital Filter 40 so that the resultant signal produced on terminal 46 thereof will closely match the signal from terminal 34 of Training Function Generator 30.

Subsequent to the adjusting of the operation of Adaptive Digital Filter 40 by Controller 50 as above described, the combination of Analog Signal Processing apparatus 12, Digital Signal Processing apparatus 14 and Adaptive Digital Filter 40 function to provide a desired signal processing function in accordance with an intended design criteria, with a minimum amount of undesirable side effects, as illustrated in FIG. 2. FIG. 2 is the same as FIG. 1, without Training Function Generator 30 and Controller 50. Referring to FIG. 2, an Input Signal 70 is coupled to terminal 16 of Analog Signal Processing apparatus 12, and a resultant Output Signal 80 is obtained from terminal 46 of Adaptive Digital Filter 40. As the coefficients of Adaptive Digital Filter 40 have previously been adjusted in accordance with the signal from Training Function Generator 30 (FIG. 1) as previously discussed, terminal 44 is no longer coupled to terminal 58 of Controller 50, i.e., subsequent to the adjusting of the coefficients of Adaptive Digital Filter 40, the functions of Controller 50 and Training Function Generator 30 are not required in the normal operation of the apparatus as in FIG. 2. Adaptive Digital Filter 40 functions to process the signal from terminal 22 of Digital Signal Processing apparatus 14 to remove undesirable effects introduced by the combined signal processing of Analog Signal Processing apparatus 12 and Digital Signal Processing apparatus 14.

In the preferred embodiment, Adaptive Digital Filter 40 is a Finite Impulse Response Digital Filter having a lattice configuration, with the coefficients associated therewith adjustable in accordance with control information coupled to terminal 44 thereof, as more fully discussed hereafter. Controller 50 functions to adjust those coefficients to minimize the error between the signal from terminal 34 of Training Function Generator 30 and the signal from terminal 46 of Adaptive Digital Filter 40 according to a selected correction criteria, as discussed more fully hereafter.

In accordance with the method and apparatus of the present invention, Training Function Generator 30 functions to provide a training signal on terminals 32 and 34 thereof to facilitate a determination of response characteristics of Signal Acquisition System 10. The training signal should contain sufficient energy with respect to the frequency band of interest of Signal Acquisition System 10. In addition, as aliasing is a nonlinear effect, the sampling frequency of Digital Signal Processing apparatus 14 should be high enough to avoid aliasing with respect to the signal produced by Training Function Generator 30. In further addition, as it is desirable that any resultant error signals detected by Controller 50 from the resultant signal from terminal 46 of Adaptive Digital Filter 40 and the training signal reflect only distortions present in Signal Acquisition System 10, the training signal must be synchronized with respect to its processing in Signal Acquisition System 10 and Controller 50. Consequently, Training Function Generator 30 further provides on terminal 36 thereof a trigger signal coincident with the generation of the training signal.

In addition to the foregoing, the sampling clock in Digital Signal Processing apparatus 14 must be related harmonically in frequency to the frequency of the clock in Training Function Generator 30.

In accordance with the method and apparatus of the present invention, the training signal produced by Training Function Generator 30 may be either a pulse train signal, a random sequence signal, or any signal having characteristics which are previously known by Controller 50. It should be understood with regard to the use of a pulse train signal that significant data with respect the rising or falling edge information of the signal produced thereby may not be detected if the pulses employed have an insufficient duration. In addition, however, if the duration of the pulses employed is too great, the power density spectrum of the high frequency portion will not be adequate to provide sufficient descriptive information with respect to Signal Acquisition System 10. It was consequently empirically determined in a prototype application employing a Model PG 502 Pulse Generator manufactured by Tektronix, Inc. of Beaverton, Oreg., that pulses having a duration of at least 20 nanoseconds and a frequency of 2.6 MHz represents a good compromise between the requirements in the time and frequency domains.

A random sequence generator implementation for Training Function Generator 30 (FIG. 1) based upon a seven state Emitter Coupled Logic shift register having a clock rate of 125 MHz is functionally illustrated in FIG. 3. FIG. 3 includes seven cascaded D-Type Flip-Flops 100, 110, 120, 130, 140, 150 and 160 having the Q terminal of the preceding one coupled to the D terminal of following one and the clock terminals are all connected to a common Clock 212. The D terminal of Flip-Flop 100 is coupled to receive the output signal from an Exclusive-NOR Gate 170 also included in Training Function Generator 30. The two input terminals of Exclusive-NOR Gate 170 are connected one each to the Q output terminals of Flip-Flops 100 and 160. Training Function Generator 30 further includes a Comparator 180 which has seven pairs of input terminals 182-208 and an output terminal 210. Terminal 182 is hardwired to a logic 1 level, terminals 186, 190, 194, 198, 202 and 206 are each hardwired to a logic 0 level, and the other terminals are connected to the Q output terminal of a different one of Flip-Flops 100-160. Comparator 180 functions responsive to the simultaneous occurrence of identical logic states on each pair of input terminals to produce a corresponding signal on output terminal 210, as discussed more fully hereafter. In the preferred embodiment, Comparator 180 was implemented by a Model F100166 integrated circuit manufactured by Fairchild Instruments of Mountain View, Calif. The final element of Training Function Generator 30 is Level Shifter 210. Level Shifter 210 is included to shift the voltage level of the binary signal from the Q terminal of Flip-Flop 160 to a selected voltage level as the output signal of Training Function Generator 30. The selected voltage levels which are associated with Level Shifter 210 are selected for the particular application in which the apparatus of FIG. 3 is used. In the prototype application, Clock 212 is selected to have a frequency of 125 MHz. It will be understood that as the output signal produced by the apparatus of FIG. 3 is binary in nature, the signal produced by Level Shifter 210 would correspond to both terminal 32 and 34 of FIG. 1.

The apparatus of FIG. 3 operates in the following manner. D-Type Flip-Flops 100, 110, 120, 130, 140, 150 and 160 collectively operate as a seven stage shift register, in response to a signal from Clock 212, to shift an output signal of Exclusive-NOR Gate 170 therethrough. The output signal of Exclusive-NOR Gate 170 is produced by a logical exclusive-NOR operation on the output signals from Q-Output terminals of D-Type Flip-Flops 100 and 160, respectively. The output signal from Q-Output terminal of D-type Flip-Flop 160 forms the output signal for the random sequence generator of FIG. 3, and is consequently coupled to Level Shifter 210. Comparator 180 continuously monitors the states of the D-Type Flip-Flops which comprise the seven stage shift register, and produces a trigger signal when the logic state of D-Type Flip-Flop 100 is a logic one, and the logic states of the remaining D-Type Flip-Flops 110-160 are a logic zero.

The power density spectrum of the apparatus of FIG. 3 has been demonstrated to have a range from DC to at least 70 MHz, with a magnitude decay of less than 6 dB. Compensation having increased frequency content may be achieved for broader band distorted systems by increasing the clock frequency.

Figure 4:
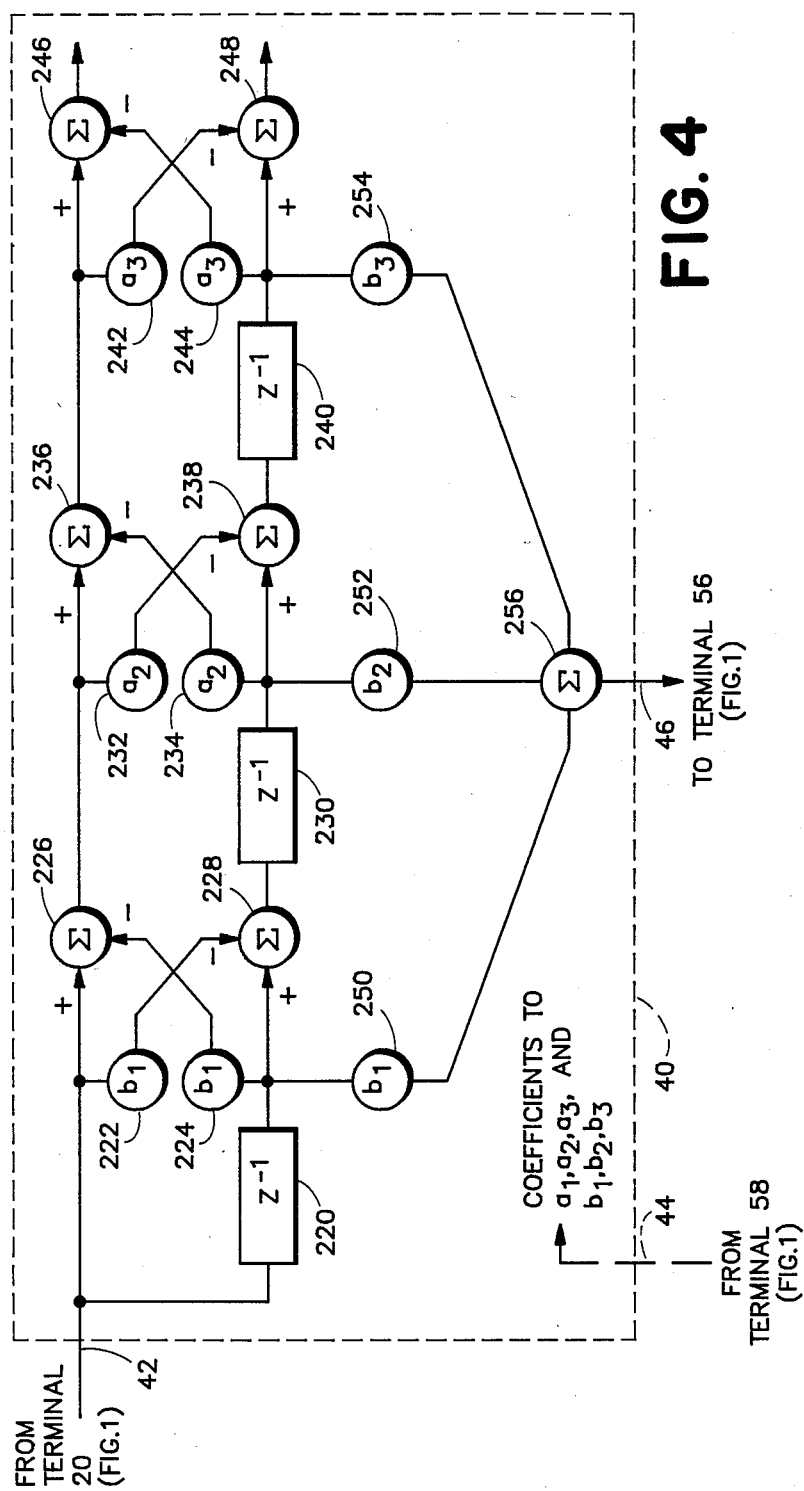
FIG. 4 is a functional block diagram for an implementation of Adaptive Digital Filter 40 (FIG. 1).

FIG. 4 is a functional block diagram of an implementation for Adaptive Digital Filter 40 of FIGS. 1 and 2. Referring to FIG. 4, Digital Delay 220 functions to delay a digital word coupled thereto from terminal 42 of Adaptive Digital Filter 40 by one clock period. Digital Delays 230 and 240 operate in an identical fashion with respect to digital words coupled thereto from Digital Adders 228 and 238, respectively. Coefficient Multipliers 222 and 224 operate to produce an output digital word equal to the product of a constant $a_1$ and a digital word coupled thereto from terminal 42 of Adaptive Digital Filter 40 and from Digital Delay 220, respectively. The constant $a_1$ is coupled to Coefficient Multipliers 222 and 224 from terminal 58 of Controller 50 (FIG. 1), as more fully discussed hereafter. Coefficient Multipliers 232 and 234 operate in a similar fashion to produce an output digital word equal to the product of a constant $a_2$ and a digital word coupled thereto from Digital Adder 226 and Digital Delay 230, respectively. The constant $a_2$ is coupled to Coefficient Multipliers 232 and 234 from terminal 58 of Controller 50 (FIG. 1), as more fully discussed hereafter. Coefficient Multipliers 242 and 244 operate in a similar fashion to produce an output digital word equal to the product of a constant $a_3$ and a digital word coupled from Digital Adder 236 and Digital Delay 240, respectively. The constant $a_3$ is coupled to Coefficient Multipliers 242 and 244 from terminal 58 of Controller 50 (FIG. 1), as more fully discussed hereafter. Digital Adder 226 operates to produce a digital word equal to a difference between the digital words coupled thereto from terminal 42 of Adaptive Digital Filter 40 and Coefficient Multiplier 224. Digital Adder 228 operates to produce a digital word equal to a difference between the digital words coupled thereto from Digital Delay 220 and Coefficient Multiplier $a_1$ 222. Digital Adders 236, 238, 246 and 248 operate in a similar manner. Coefficient Multiplier 250 operates to produce an output digital word equal to a product of a constant $b_1$ and a digital word coupled thereto from Digital Delay 220. The constant $b_1$ is coupled to Coefficient Multiplier 250 from terminal 58 of Controller 50 (FIG. 1), as more fully discussed hereafter. In a similar manner, Coefficient Multiplier 252 operates to produce a digital word equal to a product of a constant $b_2$ and a digital word coupled thereto from Digital Delay 230. The constant $b_2$ is coupled to Coefficient Multiplier 252 from terminal 58 of Controller 50 (FIG. 1), as more fully discussed hereafter. In a similar manner, Coefficient Multiplier 252 operates to produce a digital word equal to the product of a constant $b_3$ and a digital word coupled thereto from Digital Delay 240. The constant $b_3$ is coupled to Coefficient Multiplier 254 from terminal 58 of Controller 50 (FIG. 1), as more fully discussed hereafter. It is to be understood that Adaptive Digital Filter 40 is comprised of a plurality of sections: Digital Delay 220, Coefficient Multipliers 222 and 224, Digital Adders 226 and 228, and Coefficient Multiplier 250 collectively comprise a first section of Adaptive Digital Filter 40; Digital Delay 230, Coefficient Multipliers 232 and 234, Digital Adders 236 and 238, and Coefficient Multiplier 252 collectively comprise a second section; and Digital Delay 240, Coefficient Multipliers 242 and 244, Digital Adders 246 and 248, and Coefficient Multiplier 254 comprise a third section. An output signal from each of such sections is taken following the digital delay associated with the section, as more fully discussed hereafter. It is to be understood that the number of sections which are included in Adaptive Digital Filter 40 would be determined by considerations associated with the particular application in which the adaptive digital filter would be used, as would be apparent to one of ordinary skill in the art. Digital Summer 256 operates to produce a digital signal on terminal 46 of Adaptive Digital Filter 40 equal to the sum of the digital signals from each of the sections of Adaptive Digital Filter 40, e.g., for the functional implementation of Adaptive Digital Filter 40 illustrated in FIG. 4 having a total of three sections, the signal produced on terminal 46 thereof would be equal to the sum of the signals from Coefficient Multipliers 250, 252 and 254.

Figure 5:
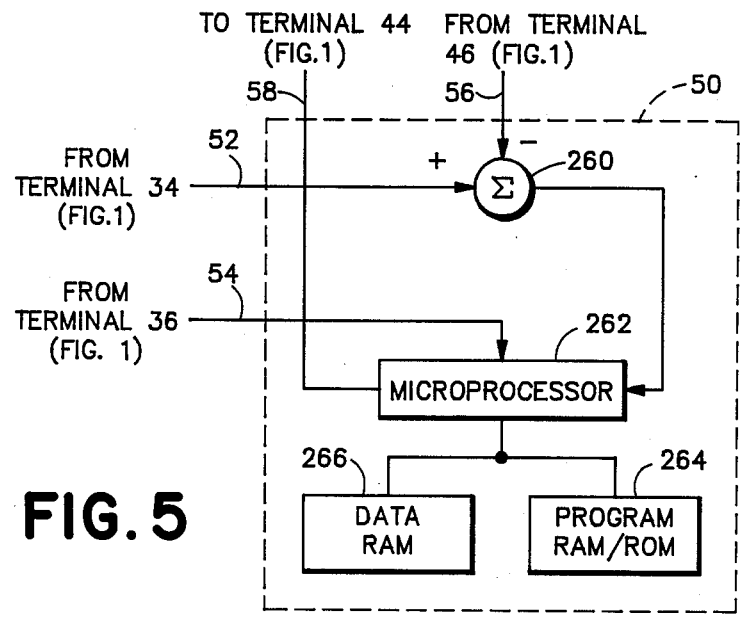
FIG. 5 is a functional block diagram for an implementation of Controller 50 (FIG. 1).

FIG. 5 is a functional block diagram of an implementation for Controller 50 of FIGS. 1 and 2. Referring to FIG. 5, Digital Adder 260 operates to produce a digital word equal to a difference between the digital word coupled to terminal 52 of Controller 50, i.e., the digital word from terminal 34 of Training Function Generator 30 (FIG. 1), and the digital word coupled to terminal 56 of Controller 50, i.e., the digital word from Digital Summer 256 (FIG. 4). The results of the operation performed by Digital Adder 260 is coupled to Microprocessor 262. Microprocessor 262, responsive to the information from Digital Adder 260, operates to determine the coefficients associated with Adaptive Digital Filter 40, i.e., the coefficients which are to be coupled to Coefficient Multipliers 222, 224, 232, 234. 242, 244, 250, 252 and 254 (FIG. 4), as more fully discussed hereafter. It is to be understood in this regard that the trigger signal from terminal 36 of Training Function Generator 30 (FIG. 1) operates to indicate to Microprocessor 262 the point in time to start acquiring data when the foregoing described apparatus is being used as a digital compensator (FIGS. 1 and 2). Microprocessor 262 has associated therewith Program RAM/ROM 264 which stores the program which Microprocessor 262 executes to determine the foregoing described coefficients, and data RAM 266 which provides temporary storage of computations made in the execution of the program.

Figure 6:
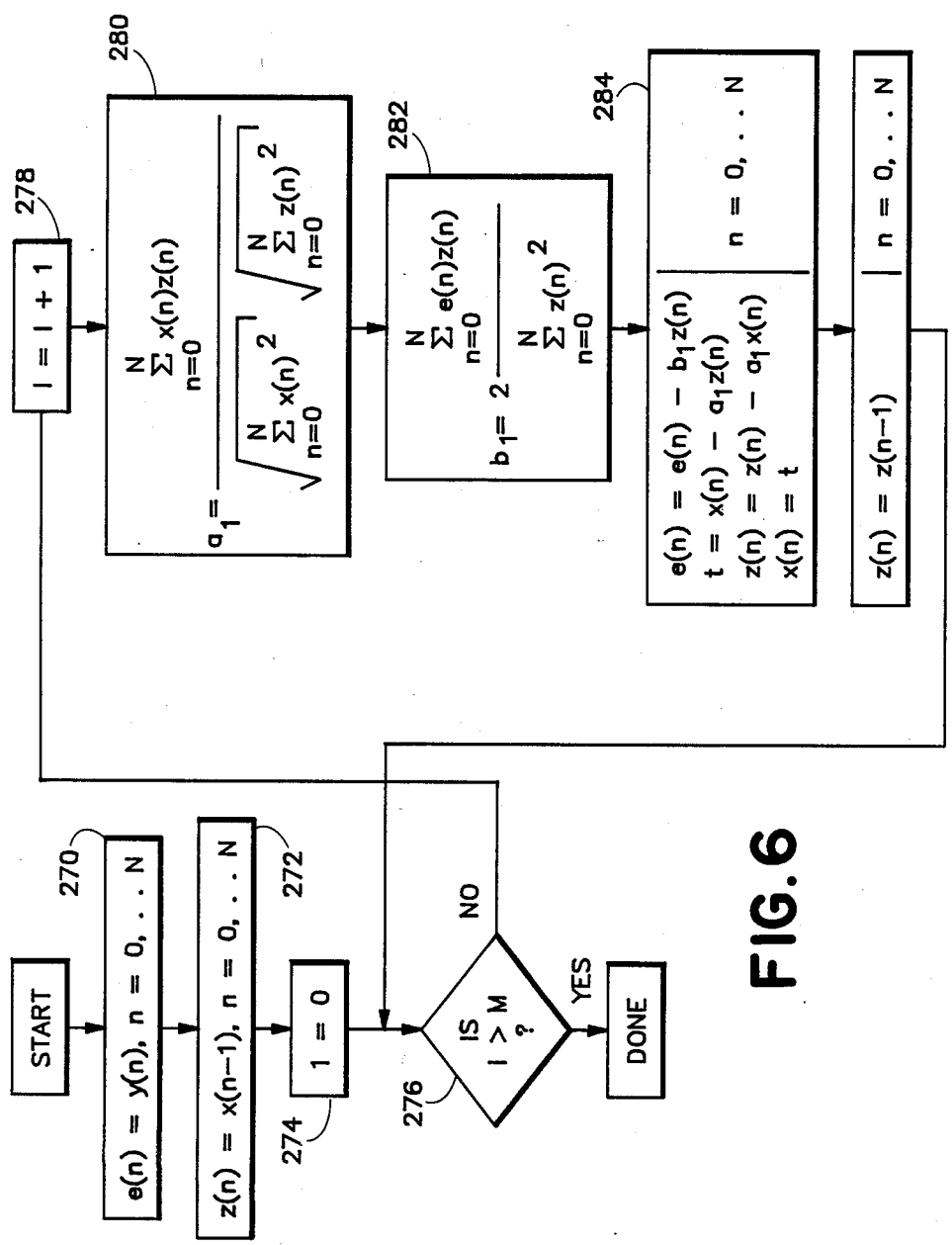
FIG. 6 is a flow chart for a sequence of steps followed in a process of determining coefficients associated with Adaptive Digital Filter 40 by Controller 50 (FIGS. 1 and 5).

FIG. 6 is a flow chart of the program which Microprocessor 262 executes to determine the foregoing described coefficients. Referring now to FIG. 6, y(n) in block 270 corresponds to a collection of data points associated with the signal from terminal 34 of Training Function Generator 30 (FIG. 1). In particular, subsequent to receipt of a trigger signal on terminal 54 from Training Function Generator 30 (FIG. 1), Microprocessor 260 operates to collect and store in e(n) a set of data points, e.g., y(1) would be a first data point, y(2) a second data point, and in general y(n) would correspond to the nth data point. The number of data points which are collected is determined by the nature of a particular application, as would be apparent to one of ordinary skill in the art. In a similar manner in block 272, a collection of data points associated with the signal from terminal 46 of Adaptive Digital Filter 40 (FIG. 4) are likewise collected, and assigned to a variable "z". In particular, data associated with the $(n-1)$th data point is assigned to the value of z(n). An index counter, "i", is initialized to a starting value of zero in block 274. The index counter is used to control the number of times the sequence of steps in blocks 278, 280, 282, 284, and 286 are performed. In block 276, the value of the index counter is compared against a maximum value, "M", to determine if the foregoing referenced sequence of steps have been performed the required number of times. The maximum value "M" corresponds to the number of sections present in Adaptive Digital Filter 40, e.g., for Adaptive Digital Filter 40 illustrated in FIG. 4, "M" would have a value of 3. The index counter is next incremented in block 278 to a value of one. Thereafter the value for the coefficient $a_1$ is next computed in block 280. It will be understood that the coefficient $a_1$ corresponds to the constant $a_1$ previously discussed with respect to Coefficient Multipliers 222 and 224 (FIG. 4). In a similar manner, the value for the coefficient $b_1$ is next determined in block 282. It will be understood in this regard that the coefficient $b_1$ corresponds to the constant $b_1$ previously discussed with respect to Coefficient Multiplier 250 (FIG. 4). Thereafter, a new set of values for e(n), z(n) and x(n) for use in determining values for subsequent coefficients are next determined in blocks 284 and 286. Thereafter, the value of the index counter is again compared against the previously discussed maximum value in block 276, and the foregoing described series of steps in blocks 278, 280, 282, 284, and 286 are again performed for the next value of the index counter. The process is repeated until values are computed for each of the coefficients associated with each section of Adaptive Digital Filter 40 (FIG. 4). Thereafter, the values of the coefficients are coupled from terminal 58 of Microprocessor 262 to the corresponding coefficient multipliers associated with Adaptive Digital Filter 40 (FIG. 4).

For purposes of discussion, a Least Mean Square algorithm was employed as a correction criteria, it should be understood however, that any of a wide variety of correction criteria may alternately be employed, as would be apparent to one of ordinary skill in the art. Consequently, the method and apparatus of the present invention is not to be considered as limited to a Least Mean Square correction criteria.

Subsequent to the determination and coupling of the coefficients to the coefficient multipliers of Adaptive Digital Filter 40 as above discussed, Training Function Generator 30 and Controller 50 may be removed, and Signal Acquisition System 10 and Adaptive Digital Filter 40 used for the processing of Input Signal 70 (FIG. 2).

It will be understood as previously discussed, Training Function Generator 30 may alternately operate to produce an output signal on terminals 32 and 34 responsive to receipt of a trigger signal on terminal 36 from Controller 50. In this application, Microprocessor 262 would produce the trigger signal on terminal 54 of Controller 50 (FIG. 5), and thereafter perform the previously discussed sequence of steps beginning with block 270 (FIG. 6).

In an alternate embodiment of the present invention, the digital compensator/equalizer may be used to equalize two or more signal channels. In particular, one signal channel is used as a reference channel, and the remaining signal channels are equalized such that a common input to all of the channel will produce output signals similar to that in the reference channel.

FIG. 7 is a functional block diagram of apparatus in accordance with the method and apparatus of the present invention with respect to the equalization of two or more channels. Referring to FIGS. 7 and 8, Signal Acquisition Systems 300 and 320 each represent an independent signal channel, and are each identical to Signal Acquisition System 10 previously discussed with respect to FIGS. 1 and 2. In particular, Signal Acquisition System 300 includes Analog Signal Processing apparatus 302 and Digital Signal Processing apparatus 304, and Signal Acquisition System 320 includes Analog Signal Processing apparatus 322 and Digital Signal Processing apparatus 324. Also included in the functional block diagram of FIG. 7 is Waveform Generator 340. Adaptive Digital Filter 40 and Controller 50 are identical to Adaptive Digital Filter 40 and Controller 50 previously discussed with respect to FIG. 1.

The apparatus of FIG. 7 is configured as is the apparatus in FIG. 1 with Signal Acquisition system 300 in place of Signal Acquisition System 10 and Signal Acquisition System 320 inserted in the signal path between the signal source, Waveform Generator 340, and Controller 50.

In a similar manner as was previously discussed with respect to Training Function Generator 30 (FIG. 1), Waveform Generator 340 functions to provide a signal on terminal 342 thereof to facilitate a determination of response characteristics of Signal Acquisition Systems 300 and 320. The signal should contain sufficient energy with respect to the frequency band of interest of Signal Acquisition Systems 300 and 320. In addition, as aliasing is a nonlinear effect, the sampling frequency of Digital Signal Processing apparatus 304 and 324 should be high enough to avoid aliasing with respect to the signal produced by Waveform Generator 340. In a prototype application, Waveform Generator 340 was selected to generate a clipped FM signal that sweept a wide frequency range that could be approximated by a one-zero sequence.

The apparatus of FIG. 7 operates in the following manner. Waveform Generator 340 provides a selected reference signal to Analog Signal Processing apparatus 302 and 322. It will be understood in this regard that as an identical signal is being coupled to both Signal Acquisition System 300 and 320, the trigger signal previously discussed with respect to FIG. 1, i.e., the signal coupled between terminal 36 of Training Function Generator 30 and terminal 54 of Controller 50, is not required. Analog Signal Processing apparatus 302 and Digital Signal Processing apparatus 304 provide processing on the signal from waveform Generator 340 in accordance with previously selected design criteria. In a similar manner, Analog Signal Processing apparatus 322 and Digital Signal Processing apparatus 324 likewise provide processing on the signal from Waveform Generator 340 in accordance with previously selected design criteria. However, as analog systems are subject to frequency and tolerance limitations, they generally do not produce a signal in strict accordance with an intended design criteria, the resultant signals from Digital Signal Processing apparatus 304 and 324, respectively, will generally be different in varying degrees, notwithstanding a fact that both Signal Acquisition Systems 300 and 320 may have been designed according to an identical design criteria. Adaptive Digital Filter 40, responsive to control information coupled to terminal 44 thereof from Controller 50 functions to provide additional signal processing functions to minimize differences between the signal from Signal Acquisition system 300 and the corresponding signal from Signal Acquisition System 320. In particular, Controller 50 functions to compare the signal from Digital Signal Processing apparatus 324 with the signal from Adaptive Digital Filter 40, and in response to a detected difference therebetween, to produce control information on terminal 58 thereof which, when coupled to terminal 44 of Adaptive Digital Filter 40, operates to adjust the operation of Adaptive Digital Filter 40 so that the resultant signal produced on terminal 46 thereof will closely match the signal from Digital Signal Processing apparatus 324.

Adaptive Digital Filter 40 and Controller 50 illustrated in FIG. 7 operate in an identical manner as was previously discussed with respect to FIGS. 4, 5 and 6. It is to be understood that any of a variety of correction criteria may be employed by Controller 50 in the digital equalization application discussed with respect to FIG. 7, as would be apparent to one of ordinary skill in the art. Consequently, the method and apparatus of the present invention is not to be considered as being restricted to employing a Least Mean Square correction criteria for digital equalization applications.

Subsequent to the adjusting of the coefficients of Adaptive Digital Filter 40 by Controller 50 as above described, the combination of Signal Acquisition System 300 and Adaptive Digital Filter 40 functions to provide nearly identical signal processing as that performed by Signal Acquisition System 320, with a minimum difference therebetween, as illustrated in FIG. 8. Referring to FIG. 8, it can be seen that it is the same as FIG. 7 with Controller 50 and Waveform Generator 340 removed, separate input signals applied to Signal Acquisition Systems 300 and 320, and separate output signals 380 and 400 taken from each path. Adaptive Digital Filter 40 functions to process the signal from Digital Signal Processing apparatus 304 to provide adjustments thereto in accordance with operational characteristics of Signal Acquisition system 320.

It is to be further understood that the foregoing described equalization technique may in a similar manner be employed with any number of signal acquisition systems, with each such system having the coefficients of an associated Adaptive Digital Filter 40 adjusted in a manner as previously discussed with respect to Signal Acquisition system 300.

While the foregoing has discussed a preferred embodiment of the present invention, such discussion is not to be considered in a manner as to limit the present invention thereto, as many alterations and modifications would be apparent to one of ordinary skill in the art. Consequently, the present invention is to be limited only by the scope of the following claims.

What is claimed is:

1. Time domain apparatus for compensating a digital output signal from a signal processing system, said apparatus having a training phase and an operational phase, said apparatus comprising:
   training function generator means for generating a training signal for coupling to the signal processing system and to a controller means, and a trigger signal responsive to the training signal both during said training phase;
   adaptive digital filter means to be coupled to receive the digital output signal from the signal processing system for producing the compensated digital output signal during both the training and operational phases according to control information received from said controller means during said training phase; and
   time domain controller means responsive to the training signal, the trigger signal and the compensated digital output signal for producing control information according to a time domain compensation criteria to couple multiplier coefficients to said adaptive digital filter means during said training phase, said control information being revised until said training signal and said compensated digital output signal are sufficiently similar one to the other to satisfy said compensation criteria.

2. Apparatus as in claim 1 wherein said training function generator means is a random sequence generator having means for producing a trigger signal responsive to an occurrence of a selected sequence of information.

3. Apparatus as in claim 1 wherein said training function generator means comprises:
   a plurality of storage devices comprised of a first and subsequent storage devices configured in a cascaded fashion for producing the training signal responsive to the serial transfer of information therethrough;
   combinational coupling means coupled to selected storage devices for combining information from the selected storage devices in a selected manner and subsequently coupling a signal produced in response thereto to the first storage device; and
   comparing means coupled to each of the plurality of storage devices and to a preselected comparison criteria signal for producing the trigger signal in response to the plurality of storage devices containing the preselected comparison criteria.

4. Apparatus as in claim 1 wherein said training function generator is a pulse train generator.

5. Apparatus as in claim 1 wherein said adaptive digital filter is a finite impulse response digital filter.

6. Apparatus as in claim 5 wherein said finite impulse response digital filter has a lattice configuration.

7. Apparatus as in claim 1 wherein said controller means comprises:
   digital adder means disposed to be responsive to the compensated digital output signal and the training signal for determining a difference therebetween;
   information storage means coupled to a microprocessor means for providing storage and retrieval of information; and
   microprocessor means coupled to said digital adder means, to said information storage means and to the trigger signal for producing the control information.

8. Apparatus as in claim 1 wherein the compensation criteria employed by said controller means is a least mean squares criteria.

9. Time domain apparatus for compensating a digital output signal from a signal processing system, said apparatus having a training phase and an operational phase, said apparatus comprising:
   training function generator means responsive to a trigger signal for generating a training signal for coupling to the signal processing system and to a controller means, during said training phase;
   adaptive digital filter means to be coupled to receive the digital output signal from the signal processing system for producing the compensated digital output signal during both the training and operational phases according to
   control information received from said controller means during said training phase; and
   time domain controller means for producing a trigger signal for coupling to said training function generator means, and control information responsive to the training signal and the compensated digital output signal, according to a time domain compensation criteria to couple multiplier coefficients to said adaptive digital filter means during said training phase, said control information being revised until said training signal and said compensated digital output signal are sufficiently similar one to the other to satisfy said compensation criteria.

10. Time domain apparatus for compensating a digital output signal from a signal processing system having an analog signal input port, said apparatus having a training phase and an operational phase, said apparatus comprising:
    training function generator means for generating a training signal in an analog format for coupling to the analog signal input port, a training signal in a digital format and a trigger signal responsive to the digital training signal each during said training phase;
    adaptive digital filter means to be coupled to receive the digital output signal from the signal processing system for producing the compensated digital output signal during both the training and operational phases according to control information received from a controller means during said training phase; and time domain controller means responsive to the digital training signal, the trigger signal and the compensated digital output signal for producing control information according to a time domain compensation criteria to couple multiplier coefficients to said adaptive digital filter means during said training phase, said control information being revised until said digital training signal and said compensated digital output signal are sufficiently similar one to the other to satisfy said compensation criteria.

11. Time domain apparatus for producing an equalized digital output signal from a first signal channel according to information from a digital output signal from a second signal channel, said apparatus having a training phase and an operational phase, said apparatus comprising:

signal generation means to be coupled to the first and second signal channels for generating a training signal during the training phase;

adaptive digital filter means coupled to receive the digital output signal from the first signal channel during both the training and the operational phases and control information from a controller means during the training phase for producing the equalized digital output signal during both the training and the operational phases; and time domain controller means responsive to the digital output signal from the second signal channel and the equalized digital output signal for producing control information according to a time domain equalization criteria to couple multiplier coefficients to said adaptive digital filter means during said training phase, said control information being revised until said digital output signal from the second channel and said equalized digital output signal are sufficiently similar one to the other to satisfy said equalization criteria.

12. Apparatus as in claim 11 wherein said adaptive digital filter means is a finite impulse response digital filter.

13. Apparatus as in claim 12 wherein said finite impulse response digital filter has a lattice configuration.

14. Apparatus as in claim 11 wherein said controller means comprises:

digital adder means responsive to the equalized digital output signal and the digital output signal from the second signal channel for determining a difference therebetween;

information storage means coupled to a microprocessor means for providing storage and retrieval of information; and microprocessor means coupled to said digital adder means and to said information storage means for producing the control information.

15. Apparatus as in claim 11 wherein the compensation criteria employed by said controller means is a least mean squares criteria.

16. A method for producing an equalized digital output signal from a digital output signal from a first signal channel according to information from a digital output signal from a second signal channel, comprising the steps of:

coupling a signal to the first and second signal channels;

producing the equalized digital output signal responsive to the digital output signal from the first signal channel and control information; and producing control information according to an equalization criteria responsive to the digital output signal from the second signal channel and the equalized digital output signal.

* * * * *